United States Patent
Delage et al.

(10) Patent No.: US 7,884,660 B2
(45) Date of Patent: Feb. 8, 2011

(54) VARIABLE-LENGTH DIGITALLY-CONTROLLED DELAY CHAIN WITH INTERPOLATION-BASED TUNING

(75) Inventors: Jean-Francois Delage, Montreal (CA); Hormoz Djahanshahi, Port Moody (CA); Guillaume Fortin, Verdun (CA)

(73) Assignee: PMC-Sierra, Inc., Burnaby, B.C. (CA)

(*) Notice: Subject to any disclaimer, the term of this patent is extended or adjusted under 35 U.S.C. 154(b) by 0 days.

(21) Appl. No.: 12/767,092

(22) Filed: Apr. 26, 2010

(65) Prior Publication Data

US 2010/0201418 A1 Aug. 12, 2010

Related U.S. Application Data

(63) Continuation of application No. 12/137,394, filed on Jun. 11, 2008, now Pat. No. 7,733,149.

(51) Int. Cl.
H03H 11/26 (2006.01)
(52) U.S. Cl. ............... 327/270; 327/274; 327/278; 327/280; 327/407
(58) Field of Classification Search ............ 327/270, 327/272, 274, 276–278, 280, 281, 407–410, 327/560–562, 359
See application file for complete search history.

(56) References Cited

U.S. PATENT DOCUMENTS

| | | | |
|---|---|---|---|
| 4,169,256 A | 9/1979 | Bergman et al. | |
| 4,380,742 A | 4/1983 | Hart | |
| 4,712,224 A | 12/1987 | Nelson | |
| 4,888,729 A | 12/1989 | Nelson | |
| 5,012,437 A | 4/1991 | Recker et al. | |
| 5,214,682 A | 5/1993 | Clark | |
| 5,638,010 A | 6/1997 | Adams | |
| 5,708,395 A | 1/1998 | Yamauchi et al. | |
| 5,739,725 A | 4/1998 | Ferraiolo et al. | |
| 6,028,488 A | 2/2000 | Landman et al. | |
| 6,094,081 A | 7/2000 | Yanagiuchi | |
| 6,239,646 B1 * | 5/2001 | Navabi et al. | ............. 327/407 |

(Continued)

OTHER PUBLICATIONS

Sidiropoulos, et al. "A Semidigital Dual Delay-Locked Loop", IEEE Journal of Solid-State Circuits, Nov. 1997, pp. 1683-1692, vol. 32., 11, IEEE.

(Continued)

*Primary Examiner*—An T Luu
(74) *Attorney, Agent, or Firm*—Townsend and Townsend and Crew LLP

(57) ABSTRACT

A programmable delay element, variable-length delay chain, and ring oscillator are disclosed. The programmable delay element performs phase interpolation of input signals in response to a control signal and can be used in combination with other delay elements to create a highly-modular, variable-length delay chain or ring oscillator. The ring oscillator can be used as part of a digitally-controlled oscillator (DCO) in a digital clock synthesizer to adjust the frequency and phase of a clock signal by fractional unit delay steps. Within the variable-length delay chain, some programmable delay elements can be configured to scale the delay-step of other programmable delay elements so that a plurality of step sizes can be implemented with identical delay elements. Also, variations of the delay chain generate in-phase and quadrature phase (I/Q) signals in either an end-tap or center-tap configuration.

22 Claims, 7 Drawing Sheets

U.S. PATENT DOCUMENTS

| | | |
|---|---|---|
| 6,606,004 B2 | 8/2003 | Staszewski et al. |
| 6,734,741 B2 | 5/2004 | Staszewski et al. |
| 6,774,693 B2 | 8/2004 | Carr |
| 6,784,755 B2 | 8/2004 | Lin et al. |
| 6,791,422 B2 | 9/2004 | Staszewski et al. |
| 6,825,707 B2 * | 11/2004 | Viehmann et al. ........... 327/407 |
| 6,903,615 B2 | 6/2005 | Landman et al. |
| 7,046,098 B2 | 5/2006 | Staszewski |
| 7,132,895 B2 | 11/2006 | Roth |
| 7,212,073 B2 | 5/2007 | Youssoufia et al. |
| 7,394,300 B2 * | 7/2008 | Chae ........................... 327/261 |
| 7,456,665 B2 * | 11/2008 | Hinz et al. .................. 327/158 |
| 7,733,149 B2 | 6/2010 | Delage et al. |

OTHER PUBLICATIONS

Non-Final Office Action for U.S. Appl. No. 12/137,394, mailed on Sep. 25, 2009, 11 pages.

Notice of Allowance for U.S. Appl. No. 12/137,394, mailed on Jan. 26, 2010, 7 pages.

* cited by examiner

VARIABLE-LENGTH DIGITALLY-CONTROLLED DELAY CHAIN WITH INTERPOLATION-BASED TUNING

CROSS-REFERENCE TO RELATED APPLICATION

This application is a continuation of U.S. patent application Ser. No. 12/137,394, filed Jun. 11, 2008, now U.S. Pat. No. 7,733,149 and entitled "A Variable-Length Digitally-Controlled Delay Chain With Interpolation-Based Tuning," which is incorporated herein by reference in its entirety.

BACKGROUND

The present invention generally relates to delay chains, and more particularly to variable-length delay chains, digitally controlled oscillators, and programmable delay elements.

Digital techniques are widely used to synthesize clock signals. In a typical system, a digital clock synthesis unit (DCSU) includes a phase detector, filter, digitally-controlled oscillator (DCO), and divider arranged in a feedback loop. The phase detector compares the divided frequency of the DCO to a reference signal and transforms the phase or frequency difference into an error signal. The error signal is filtered and delivered to the DCO. The DCO responds to the filtered error signal by advancing or retarding the phase of the output signal. In this way, the DCSU tracks changes in the reference signal.

Unlike analog oscillators, DCOs use a digital input and can therefore assume only a finite number of oscillation frequencies. This means a DCO can never really produce an output clock which is perfectly synchronized with its reference; instead, it can only approximate such a clock by chattering back and forth between two adjacent frequencies bounding the target frequency. This process creates jitter or phase noise on the synthesized clock analogous to quantization noise in DACs (digital-to-analog converters) and ADCs (analog-to-digital converters).

The magnitude of the jitter, or the peak phase error, depends directly on the granularity of the frequency steps of the DCO and on the rate of change between two adjacent frequencies. In other words, a DCO with finer frequency steps and higher input control change rate will introduce less jitter on the output clock. Conventional digital clock synthesis units can produce relatively large delay steps and correspondingly large amounts of phase noise which may be unsuitable for many applications. There is thus a need in the art for improvements in the area of digital clock synthesis.

SUMMARY OF EMBODIMENTS

Embodiments of a programmable delay element, variable-length delay chain, and ring oscillator are disclosed. The programmable delay element performs phase interpolation of input signals in response to a control signal and can be used in combination with other delay elements to create a highly modular, variable-length delay chain or ring oscillator. The ring oscillator can be used as part of a digitally-controlled oscillator (DCO) in a digital clock synthesizer to adjust the frequency and phase of a clock signal by fractional unit delay steps. In some embodiments, programmable delay elements can be configured to scale the delay-step of other programmable delay elements in the variable-length delay chain so that a plurality of step sizes can be achieved with identical delay elements. Also, in some embodiments, the variable-length delay chain generates I/Q (in-phase, quadrature-phase) signals in either an end-tap or a center-tap configuration.

In one embodiment, a programmable delay element includes a buffer that can receive a source signal at a first input of the delay element and provide a first delayed replica of the source signal at a first output of the delay element. The delay element also includes an interpolating multiplexer which has a first input coupled to an output of the buffer, a second input coupled to a second input of the programmable delay element for receiving a second delayed replica of the source signal, and a third input for receiving a digital control signal comprising a plurality of bits. The interpolating multiplexer comprises a plurality of switching elements with each switching element being operative in response to a corresponding bit of the digital control signal. An output signal of the interpolating multiplexer comprising a first contribution of the first delayed replica and a second contribution of the second delayed replica is delivered to a second output of the delay element. The first and second contributions are determined in accordance with a state of the plurality of switching elements.

In another embodiment, a programmable delay chain is disclosed. The delay chain includes at least first, second, and third delay elements. Each delay element has a buffer that can receive a source signal at a first input of the delay element and provide a first delayed replica of the source signal at a first output of the delay element. Each delay element also includes an interpolating multiplexer with a first input coupled to an output of the buffer, and a second input coupled to a second input of the delay element for receiving a further delayed replica of the source signal. Each of the interpolating multiplexers includes a plurality of switching elements operative in response to corresponding bits of the digital control signal. Each interpolating multiplexer produces an output signal at a second output of the programmable delay element including a first contribution of the first delayed replica and a second contribution of the second delayed replica in accordance with a state of the switching elements. The first, second, and third delay elements form a chain in which the first inputs and first outputs of the delay elements comprise a forward signal path and the second inputs and second outputs of the delay elements comprise a return signal path.

In a further embodiment, a delay chain having a plurality of programmable delay elements connected to exchange forward and return path clock signals is disclosed. Each programmable delay element in the delay chain generates an output signal by combining discrete portions of its respective forward and return path clock signals according to an index of interpolation. The first programmable delay element has a first index of interpolation and is configured to produce an interpolated output by combining a first portion of an input clock signal received on its forward path and a second portion of its return path clock signal as determined by the first index of interpolation. The second programmable delay element has a second index of interpolation and is configured to receive its forward path clock signal from the first programmable delay element, and to produce a second interpolated output by combining a first portion of its forward path signal and a second portion of its return path clock signal as determined by the second index of interpolation. The third programmable delay element has a third index of interpolation and is configured to receive its forward path clock signal from the second programmable delay element, and to produce a third interpolated output signal as determined by the third index of interpolation. The return path clock signal of the second programmable delay element comprises the interpolated output of the third programmable delay element and the return path clock signal of the first programmable delay element comprises the interpolated output of the second programmable delay element.

In the figures, similar components and/or features may have the same primary reference designator. Various components of the same type may be distinguished by following the primary reference designator by a secondary designator such as a letter or symbol that distinguishes among the similar components (e.g., 100A, 100B . . . ). If only the primary reference designator is used, the discussion is applicable to any of the components labeled with that same primary reference designator.

DETAILED DESCRIPTION OF EMBODIMENTS

Figure 1:
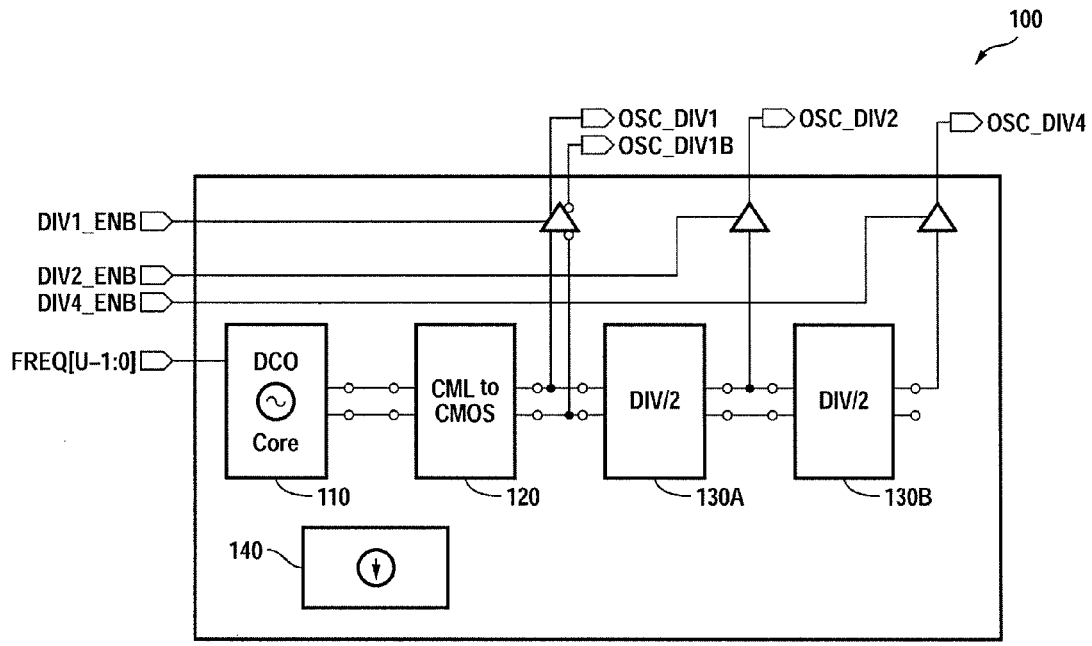
FIG. 1 is a block diagram of a digitally controlled oscillator (DCO) in accordance with one embodiment of the present invention.

FIG. 1 shows a digitally controlled oscillator (DCO) 100 in accordance with an exemplary embodiment of the present invention. DCO 100 receives a digitally coded frequency control signal FREQ at its input and produces one or more clock signals at its outputs. Enable signals *_ENB control which of the multiple output clock signals are active at a particular time. As shown, signal DIV1_ENB enables or disables differential outputs OSC_DIV1 and OSC_DIV1B while signals DIV2_ENB and DIV4_ENB control outputs OSC_DIV2 and OSC_DIV4, respectively. It will be recognized that DCO 100 may supply more or fewer than three output clocks signals and that the output signals may have various relationships such as in-phase, quadrature phase (I/Q), frequency division (DIV1, DIV2, DIV4), etc.

DCO core 110 receives control signal FREQ and adjusts the frequency of its output signal in response thereto. In some embodiments, DCO core 110 includes a plurality of programmable delay elements configured in a ring topology in which individual delay elements propagate signals in both a forward and return direction. Based upon the control signal, individual delay elements can be added to or removed from the ring. Moreover, depending upon the control signal, DCO core 110 can make fine adjustments to the frequency of its output signals. In one embodiment, DCO 110 performs phase interpolation at one or more of its programmable delay elements and control signal FREQ sets the interpolation level or levels. For example, control signal FREQ may specify the portion of the forward path signal at a particular delay element that is combined with that element's return path signal to achieve very small frequency steps. Among other applications, DCO 100 can be implemented as part of a SoC (system-on-chip) design.

In some embodiments, DCO core 110 is implemented using current-mode logic. CML gates can reduce delay dependency on power supply variations, permit higher oscillation frequencies over variations in process, voltage and temperature (PVT) as well as achieving a tighter frequency range. Also, CML gates facilitate the use of differential signaling which can further reduce sensitivity to common-mode, power supply and substrate noise. In other embodiments, DCO core 110 may include delay elements and support circuits based on different gate topologies such as CMOS.

CML-to-CMOS conversion block 120 adjusts the level of the CML output of DCO core 110 for use with downstream CMOS components. As shown, the differential output of CMOS conversion block 120 forms the base output signal (OSC_DIV1) of DCO 100. Dividers 130A, 130B receive the base output signal and use it to produce different output frequencies. For example, divider 130A divides the frequency of the base output signal by two and produces single-ended output signal OSC_DIV2. Divider 130B divides the base signal in half again to produce output signal OSC_DIV4. Current source 140 supplies a reference current to DCO core 110 and other components of DCO 100.

Figure 2:
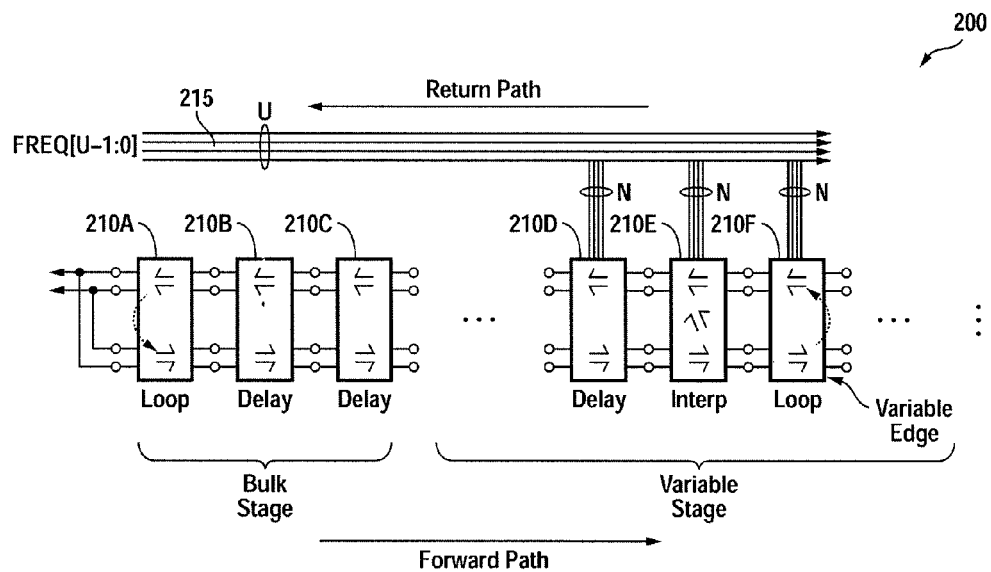
FIG. 2 is a high-level schematic diagram showing one embodiment of a delay chain configured as a ring oscillator such as can form the digitally controlled oscillator core depicted in FIG. 1.

FIG. 2 shows one embodiment of a delay chain 200 configured as a ring oscillator such as can be used to implement DCO core 110. Delay chain 200 includes a plurality of programmable delay elements 210 in which each programmable delay element 210 is connected to at least one other delay element. As shown, programmable delay elements 210 form a loop in which a clock signal travels along a forward path from the head of the chain 210A to a terminal delay element (not shown), and back to the head of the chain 210A along a return path. The head of the chain 210A passes the return signal back along the forward path to maintain oscillation in the ring. Although a ring topology is discussed, it will be understood that delay chain 200 can be configured to provide a programmable delay without necessarily maintaining self-oscillation. For example, in the case of delay-lock loop (DLL) and similar applications, delay element 210A needs not loop the return path signal back to the forward path, but may provide its output after having added the desired amount of delay to a clock signal supplied at the forward path input of programmable delay element 210A.

Delay chain 200 can be thought of as having fixed and variable parts. The fixed part supplies a bulk delay and can include a predetermined number of delay elements 210. This bulk delay stage, for example, can provide a minimal delay appropriate to a particular application and can ensure that the requirements for maintaining oscillation (i.e., Barkhausen criteria) are satisfied. More specifically, the bulk delay stage can provide a minimum gain and phase shift to sustain oscillation and can also be used to set the maximum oscillation frequency of delay chain 200 when the variable stage is minimized. The other elements in the delay chain 200, including elements 210D-210F, form the variable stage. Each individual delay element can be enabled or disabled thereby varying the length of delay chain 200 in accordance with signals from control bus 215. Individual delay elements 210 may be the same—for example, they may have the same range of delay values—or they may be different.

Signals from control bus 215 determine the operation of variable-stage programmable delay elements 210D-F. As shown, control bus 215 carries signal FREQ[U−1:0] and delivers N-bits thereof to each variable-stage delay element. For simplicity, variable-stage delay elements 210D-F are labeled as performing either a loop-back (Loop), pass-through (Delay), or interpolating (Interp) function. Loop-back elements 210A, 210F transfer signals between the forward and return paths as indicated by curved arrows. Delay element 210A, for example, passes substantially all of the signal from the return path back onto the forward path, whereas delay element 210F passes substantially all of the signal from the forward path back to the return path.

Pass-through elements 210B-210D pass the signal along the forward and return paths. Each pass-through element adds a unit of propagation delay. For example, if the full delay of a programmable delay element 210 is 36 ps, then the element will add a 36 ps delay when operating as either a pass-through or loop-back element. Adding or removing these elements thus changes the total oscillation period of delay chain 200 by approximately 72 ps for a clock cycle that is defined by traversing the loop twice.

Interpolating delay element 210E provides phase interpolation by combining a portion of its forward path signal with its return path signal. As illustrated by the diagonal arrows, interpolating element 210E produces an output signal in which both the forward path and the return path signals are represented. By changing the relative contributions of the forward signal and the return signal to the output signal, the propagation delay of delay chain 200 can be changed by fractional unit delays. This, in turn, produces small phase steps in the delay chain and hence small frequency steps in the DCO output clock. The amount of phase interpolation at delay element 210E is determined by signals from control bus 215. Delay chain 200 may include many more programmable delay elements, some of which may be inactive or powered-down. Although not shown, in a typical delay chain configuration, a delay element immediately following the variable edge is used for signal termination but does not contribute to its overall propagation delay.

Figure 3:
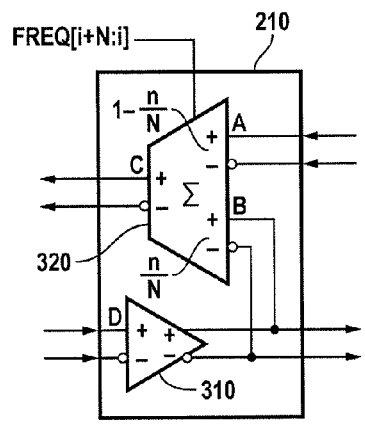
FIG. 3 is a high-level block diagram of a programmable delay element performing phase interpolation of forward and return path signals.

FIG. 3 is a high-level block diagram of a programmable delay element 210 performing phase interpolation of forward and return path signals. Programmable delay element 210 includes, in part, buffer 310 and interpolating multiplexer 320. Buffer 310 receives a source signal at input D and provides a delayed replica of the source signal at its output. In some embodiments, all programmable delay elements 210 in a delay chain 200 include a buffer 310 with approximately the same delay between its input and output terminals to facilitate uniform step sizes as the operation of the delay elements changes. In other embodiments, however, buffers 310 and muxes 320 in some or all of the programmable delay elements 210 may provide different amounts of delay. For example, programmable delay elements 210A-210C in the bulk stage of delay chain 200 may have buffers 310 and muxes 320 that provide relative large delays for establishing a base oscillation frequency whereas delay elements 210D-210F in the variable stage of delay chain 200 may provide relatively small delays for fine-step control around the base frequency.

In the presently described embodiment, interpolating multiplexer 320 receives the forward path signal at input B and the return path signal at input A. The forward path signal represents a replica of the source signal at buffer input D delayed by the gate delay of buffer 310 as previously discussed. The return path signal at input A can be a replica of the source signal that is further delayed by one or more additional delay elements in a ring oscillator or delay chain such as delay chain 200. For example, in the case of interpolating element 210E (FIG. 2), the return path signal received at input A can represent the source signal received from element 210D after accounting for delay introduced by its buffer 310 and by delay element 210F. As with buffer 310, the delay added by interpolating multiplexer 320 can be the same or it can vary among different delay elements 210.

Interpolating multiplexer 320 also receives signal FREQ at its control input. Signal FREQ may represent an N bit portion of control bus 215 that corresponds to the position of delay element 210 in a delay chain or ring oscillator configuration. Based upon signal FREQ, interpolating multiplexer 320 provides an output signal at C in which the phases of its forward and return path signals are proportionally represented. For example, in various embodiments, signal FREQ can be a thermometer coded digital signal. Using a "level" (referring to the arrangement of 1's and 0's in the thermometer coded signal) or index of interpolation n of the N bits comprising signal FREQ, interpolating multiplexer 320 adjusts the contribution of the delayed forward path signal at input B (n/N) to output C thereby reducing the contribution of the return path signal at input A to (1−n/N), where n=0, 1, ... N. Thus, the phase of the signal at output C can be advanced or retarded in N steps over a range equal to the sum of delays of buffer 310 and multiplexer 320.

When n=0, interpolating multiplexer 320 operates as a pass-through element. In this state, the forward path signal is passed along to the next delay element and the output of buffer 310 is not included in output C. Similarly, when n=N, interpolating multiplexer 320 operates as a loop-back element such that substantially all of the forward path signal at the output of buffer 310 is passed to output C with the delay of multiplexer 320. Between the pass-through and loop-back cases, interpolating multiplexer 320 combines a portion of the forward path signal with the return path signal to produce an output which progressively introduces the delay of one delay element 210, that is the sum of delays of buffer 310 and multiplexer 320 into the output signal in discrete steps.

Symbolically, let the base delay ($\tau_s$) of programmable delay element 210 equal the sum of the delays of buffer 310 ($\tau_{buffer}$) and interpolating multiplexer 320 ($\tau_{mux}$). Also, assume that the return path signal is received from a loop-back element which follows immediately in the delay chain. Since interpolating multiplexer 320 can introduce some or all of the loopback element's $\tau_s$ into the output signal, it will be recognized that programmable delay element 210 can vary the phase of its output from $\tau_s$ to $2\tau_s$ in N discrete steps.

The operation of interpolating multiplexer 320 can be further generalized as producing a weighted-sum of its inputs at its output and it can be shown that this operation produces substantially linear phase steps in response to change in the relative proportion of forward path and return path signals. Mathematically, output C can be expressed as a function of inputs A and B and the level n of the N-bit control signal as follows:

$$C = \frac{nB + (N-n)A}{N}, \text{ where } n = 0, 1, \ldots N \quad (1)$$

If the forward and return path signals are sinusoidal with arbitrary amplitudes and phase shifts, their sum can be written as:

$$X\sin\phi + Y\sin(\phi + \Delta\phi) = \qquad (2)$$

$$\sqrt{X^2 + Y^2 + 2XY\cos(\Delta\phi)} \cdot \sin\left(\phi + \arctan\left(\frac{Y\sin(\Delta\phi)}{X + Y\cos(\Delta\phi)}\right)\right)$$

Next, provided that the phases are closed spaced (i.e., $\Delta\phi < 0.3$ rad), such as in the context of delay chain 200, equation (2) can be simplified to:

$$X\sin\phi + Y\sin(\phi + \Delta\phi) \approx (X + Y) \cdot \sin\left(\phi + \Delta\phi \frac{Y}{X+Y}\right) \qquad (3)$$

Now, recognizing that the forward and return path signals have the same amplitude (K) and that their phase separation ($\Delta\phi$) can be expressed in terms of the base delay ($\tau = \tau_{buffer} + \tau_{mux}$) of programmable delay element 210 and the sine wave's period ($T_{sine}$) such that $\Delta\phi = 2\pi \cdot \tau_s/T_{sine}$ equations (1) and (3) can be restated as:

$$\begin{aligned} C &= \frac{nB + (N-n)A}{N} \qquad (4) \\ &= \frac{nK\sin\phi + (N-n)K\sin(\phi + \Delta\phi)}{N} \\ &\approx K\sin\left(\phi + \Delta\phi\left(\frac{N-n}{N}\right)\right) \end{aligned}$$

Thus, a relatively small phase shift between inputs A and B (e.g., $\tau_s/T_{sine} < 0.1$) results in reasonably linear phase steps at output C. Note that similar conclusions can be reached for long delay chains and square waveforms by performing the above analysis on the oscillation waveform's harmonic components.

Figure 4:
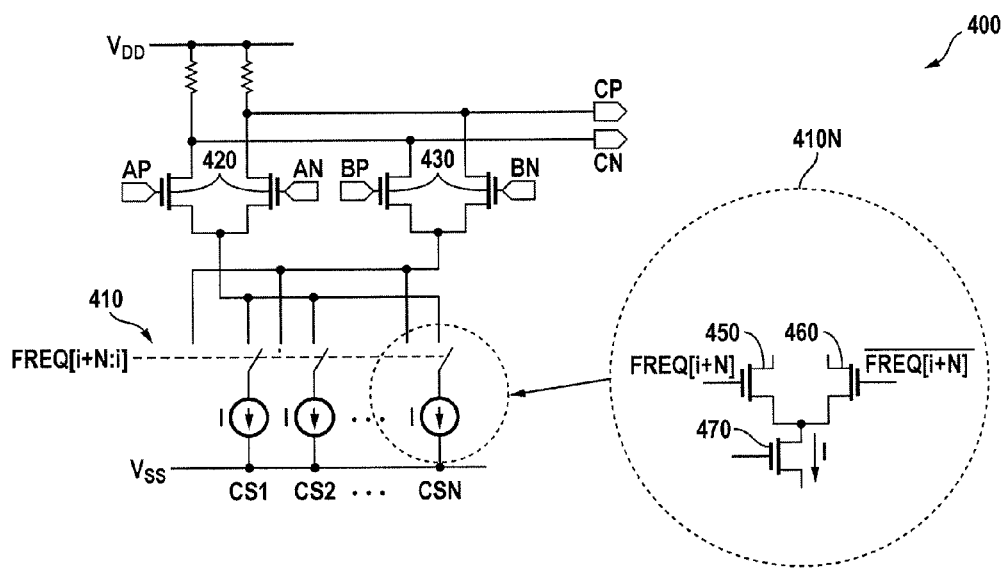
FIG. 4 is a schematic view of an interpolating multiplexer such as can be used with embodiments of the present invention.

FIG. 4 is a schematic view of an interpolating multiplexer 400 such as can be included in the programmable delay element 210 of FIG. 3. Interpolating multiplexer 400 receives differential inputs A (AP, AN) and B (BP, BN) and produces differential output C (CP, CN). In addition, interpolating multiplexer 400 receives N-bit control signal FREQ[i+N:i]. As previously mentioned, the N-bits of signal FREQ may represent a portion of a digitally coded control bus corresponding to a specific programmable delay element 210.

Interpolating multiplexer 400 includes N current steering switches 410. Each current steering switch 410 is coupled to a corresponding current source element CS and causes a current to flow in accordance with one bit of the N-bit control signal. A detail view of exemplary current steering switch 410N and current source CSN is shown as including two transistors 450, 460 whose source electrodes are connected to the drain electrode of a sourcing transistor 470. The drain terminal of the first transistor 450 is coupled to a signal representative of the signal at input B of interpolating multiplexer 400, whereas the drain terminal of the second transistor 460 is coupled to a signal representative of the signal at input A. Lastly, the gate terminals of transistors 450, 460 are coupled in complementary fashion to the i+Nth bit of control signal FREQ.

In operation, only one of transistors 450, 460 conducts in response to a particular state of FREQ[i+N] and they are thus complementary in nature. Depending upon which transistor is conducting or, analogously, the position of current steering switch 410N, current sourced by transistor 470 can flow through either differential pair 420 corresponding to input A or through differential pair 430 corresponding to input B.

Gate electrodes of first differential pair 420 are connected to differential inputs AP and AN. Similarly, gate electrodes of second differential pair 430 are connected to differential inputs BP and BN. Also, a more or less constant current flow is divided between differential pairs 420, 430 according to the state of current steering switches 410. For example, if interpolating multiplexer 400 includes a total of 16 current steering switches 410 and eight of the current steering switches cause a current to flow in differential pair 420, then approximately 50% of the total current will correspond to input A and 50% will correspond to input B. Similarly, due to their complementary nature, if only four of the current steering switches cause a current to flow in differential pair 420, then input A will represent approximately 25% of the total current flow and input B will represent about 75%.

As shown, output C includes both inputs A and B and thus represents a weighted sum of these two signals. More specifically, positive differential output CP is coupled to both differential input AN and differential input BN, whereas positive differential input AP and differential input BP are coupled to negative differential output CN due to the inversion created by differential pairs 420, 430. As such, differential output C represents a portion of input A and a portion of input B determined by the state of current steering switches 410. Interpolating multiplexer 400 thus transforms inputs A and B into output C in accordance with equation (1) and produces reasonably linear phase steps in response to change in control signal FREQ as described by equation (4). Although differential pairs 420, 430 are shown in NMOS configurations in which current source elements CS are referenced to potential $V_{SS}$ and load resistors establish voltage-mode output C, it will be recognized that equivalent PMOS differential pairs are possible and specifically contemplated within the scope of the present invention.

In some embodiments, the bits of control signal FREQ may be modulated at a high rate to reduce absolute phase error. For instance, sigma-delta modulation may be used. In a CML context, filtering the control signal provides a mean to attenuate the high frequency jitter induced by such high rate modulation, such that the current switches act as differential pairs that perform partial steering of the current thereby yielding even higher control over the delay steps of a delay element.

Figure 5A:
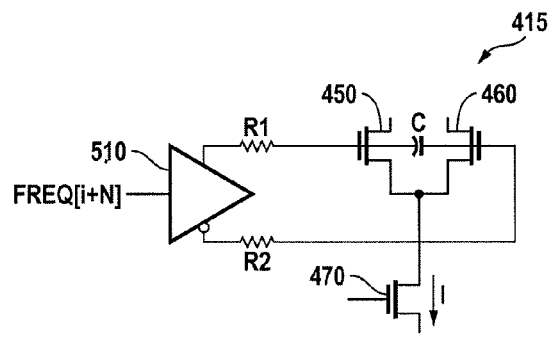
FIGS. 5A-5B show current steering switches according to embodiments of the present invention.

FIG. 5A shows a first alternative current steering switch 415 such as can be used with interpolating multiplexer 400. Current steering switch 415 further reduces the impact of phase jitter by reacting slowly to changes in control signal FREQ. As shown, buffer 510 delivers one bit of control signal FREQ to the gate electrode of transistor 450 through resistor R1. Buffer 510 also delivers complement of the control bit to the gate electrode of transistor 460 through resistor R2. Capacitor C couples the respective gate electrodes of transistors 450, 460 such that resistors R1, R2 and capacitor C introduce a time constant to the response of transistors 450, 460 and cause them to react more slowly to changes in the corresponding bit of the control signal.

Figure 5B:
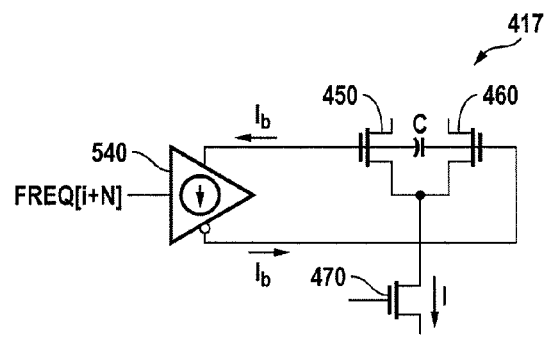

FIG. 5B shows a second alternative current steering switch 417 such as can be used with interpolating multiplexer 400. As shown, buffer 540 sources a small current $I_b$ to the gate electrode of transistor 460. Capacitor C couples both gate electrodes and provides a return path for current $I_b$. In this arrangement, capacitor C integrates current flow $I_b$ thereby limiting the rate of change of the respective gate voltages. As a result, a near-DC bias can be presented to each transistor 450, 460 smoothing the operation of current steering switch 417 in response to control signal changes.

Among other advantages, it will be noted that phase interpolation according to embodiments of the present invention can be performed asynchronously and without the need for complex phasing mechanisms. Unlike conventional devices which can require careful synchronization when adjusting the length of a delay chain in order to avoid self-sustaining runt pulses, fractional delay steps in accordance with embodiments of the present invention cause only small perturbations which are quickly filtered out. As discussed above, phase interpolation can be achieved at the level of individual current source elements so that the magnitude of any resulting perturbations is always only a fraction of the main clock wave. With noise dampening, embodiments of the present invention support asynchronous switching of multiple current source elements (multi-bit changes) at a time.

Figure 6:
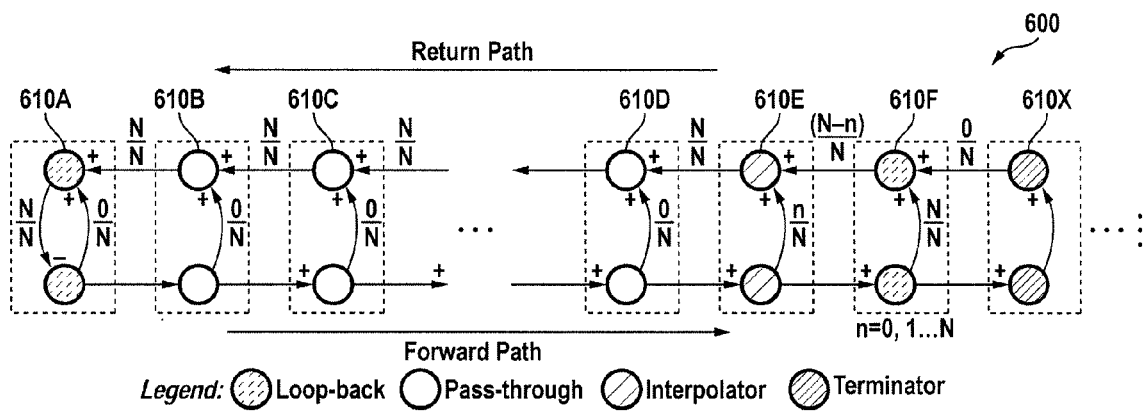
FIG. 6 illustrates aspects of a delay chain in accordance with one embodiment of the present invention.

FIG. 6 illustrates aspects of a delay chain 600 in accordance with embodiments of the present invention. Delay chain 600 is similar to delay chain 200. Straight arrows show a forward path (bottom) and return path (top) through a plurality of programmable delay elements 610 which are represented as two vertically-aligned circles. At each programmable delay element 610, one or more curved arrows indicate a relative proportion of the forward or return path signal. The delay elements 610 of delay chain 600 can be programmable delay elements 210 as shown in FIGS. 2-3 and the combination of signals can be performed by a multiplexer such as interpolating multiplexer 400.

For convenience, the programmable delay elements 610 of delay chain 600 will be discussed in terms of their operation as performing pass-through, loop-back, or interpolating functions. Delay element 610X terminates delay chain 600 and is not discussed further. It will be recognized that delay chain 600 may include many more programmable delay elements than are shown and that individual delay elements 610 may have the same or different delay characteristics. Also, depending upon the application, programmable delay elements 610 to the right of terminator 610X may be de-energized to reduce power consumption.

As shown, delay element 610A performs a loop-back function in which substantially all of the return path signal (N/N) is transferred back to forward path and substantially none (0/N) of the forward path signal is transferred to the return path. Delay element 610F performs the opposite function, transferring substantially all of the forward path signal (N/N) to the return path. Thus, delay elements 610A, 610F represent the ends of delay chain 600. In addition to looping elements 610A, 610F, delay chain 600 includes elements 610B-610D which perform a pass-through function and element 610E which performs an interpolating function as indicated by their respective curved arrows.

In general, the length of delay chain 600 may be shortened by adjusting the control signal FREQ (not shown) such that its variable edge moves to the left. Thus, when shortening the delay chain by one element, delay element 610F ceases to be a loop-back element and instead is programmed to operate as terminator 610X. Delay element 610E is programmed to be a loop-back element such that it transfers substantially all of the forward path signal to the return path. Finally, delay element 610D is programmed to operate as an interpolator by combing a portion (n/N) of its forward path signal with the return path signal received from delay element 610E. The variable edge of delay chain 600 can be repeatedly moved to the left in this manner until it reaches its minimal length.

Delay chain 600 can also be lengthened in response to control signal inputs by shifting its variable edge to the right. Thus, a single element is added by programming delay element 610X to operate as a loop-back element which transfers substantially all of the forward path signal back on to the return path. The element to the right of delay element 610X (not shown) then serves to terminate delay chain 600. Also, delay element 610F is programmed to perform an interpolating function by combing a portion (n/N) of its forward path signal with the return path signal received from delay element 610X. Finally, delay element 610E is programmed to operate as a pass-though in which substantially all of the forward path signal is transferred on to delay element 610F. It will be noted that the foregoing programming changes occur seamlessly since an individual delay element 610 can be considered either a pass-through element or an interpolator when n=0 and can be considered either an interpolator or a loop-back element when n=N. Thus, there is no discontinuity of function as delay elements 610 are reprogrammed by their respective control signals.

To further illustrate the foregoing, consider a delay chain comprising 18 programmable delay elements 610 in which one of the elements is configured to interpolate forward and return path signals. Let each delay element be configurable with 16 delay steps (N=16). Further, suppose that delay elements in positions 1-3 represent a bulk delay section of the delay chain and that elements in positions 4-18 comprise the variable stage. The delay chain is also configured so that it is terminated by delay element 18 and delay element 17 provides loop-back of the forward path on the return path. In the example, delay element 16 is programmed to perform phase interpolation and delay elements 4-15 operate as pass-through or base delay stages.

Continuing with the example of 18 delay elements, assume that the individual delay elements (4-18) each receive a thermometer coded control signal. With thermometer coding, each delay element may be assigned an N-bit portion of a control bus signal such that the relative proportions of forward path and return path signals weighted in its output are established using a consecutive string of binary digits. The following table illustrates a thermometer encoded control signal such as might be received by a delay element in accordance with embodiments of the present invention.

TABLE 1

| FREQ[i + N:i] | |
|---|---|
| 000 . . . 000 | max delay length (min frequency) |
| 000 . . . 001 | |
| 000 . . . 011 | |
| 000 . . . 111 | |
| . . . | |
| 001 . . . 111 | |
| 011 . . . 111 | |
| 111 . . . 111 | min delay length (max frequency) |

Table 1 shows an N-bit range of control signal FREQ having a thermometer coding pattern. As can be seen, a string of N consecutive zeros sets pass-through operation of a programmable delay element 610 and results in its maximum delay value. Similarly, a string of N consecutive ones represents the loop-back operation of the programmable delay element 610 with its minimum delay value. Between these extremes, strings of consecutive binary digits establish the relative proportion of forward path and return path signals enabling phase interpolation thereof. For convenience, $n_j$ is used to represent the level of interpolation of the jth programmable delay element in a delay chain.

Continuing with the previous example, letting $n_{16}=0$ transforms delay element 16 from an interpolator into a pass-through element. This may be done, for example, to lengthen the delay chain so that delay element 17 then performs any required phase interpolation (e.g., $0<n_{17}<N$) and delay element 18 performs a loop-back function ($n_{18}=N$). In such case, a 19th delay element may be added to the delay chain as a terminator. On the other hand, setting $n_{16}=N$ causes delay element 16 to act as a loop-back element such as might be done when removing a delay element to shorten the delay chain.

In general, if delay chain 600 includes M delay elements directly involved in the feedback loop (excluding termination), its total propagation delay ($\tau_c$) can be expressed as follows:

$$\tau_c = \left(M - 1 + \frac{n}{N}\right)\tau_s \quad (5)$$

It can be seen from equation (5) that total propagation delay $\tau_c$ is less than M multiplied by the base delay $\tau_s$ of each active delay element. This is due to the bypassing effect of the interpolation stage, as it essentially provides a shorter path to a portion of the propagating wave. As previously indicated, $\tau_s/N$ represents the size of a single delay step which can be produced by the interpolating element. For example, in one application, delay chain 600 can be utilized with N=16 in a SoC technology to achieve oscillation period steps of approximately 4.5 ps. Note that even finer control can be achieved by dithering the control signal through use of the alternative current steering switches depicted in FIGS. 5A-5B or multiple interpolator elements as discussed below in connection with FIGS. 7A-7C.

To illustrate the effect of phase interpolation on total propagation delay, consider the delay chain with 18 delay elements from the preceding example. Assume that $\tau_s=36$ ps, and that $n_{16}=8$ ($n/N=0.5$). In that case, the total propagation delay $\tau_c$ determined in accordance with equation (5) is 594 ps and the oscillation frequency at which a two-edge signal propagates through the delay chain is approximately 841.75 MHz. If frequency is adjusted by setting $n_{16}=7$ ($n/N=0.4375$), total propagation delay drops to approximately 589.5 ps and oscillation frequency ($f_{osc}=1/(2\cdot\tau_c)$) increases to about 848.18 MHz. Thus, in the example given, an oscillation period step of 4.5 ps of is achieved by changing a single level of interpolation or, equivalently, by adjusting the index of interpolation by one.

This result can be restated for a delay chain comprising K+1 total delay elements of which L delay elements form a bulk-delay portion, (K-L) elements represent the variable delay stage and one element is used for termination. If each bulk delay element has a propagation delay of $\tau_{sb}$ and each other delay element has a propagation delay of $\tau_s$ and also supports N levels of interpolation, then the maximum oscillation frequency is given as:

$$F_{MAX} = \frac{1}{2(L\tau_{sb} + \tau_s)} \quad (6)$$

and the minimum oscillation frequency is:

$$F_{MIN} = \frac{1}{2((K - L + 1)\tau_s + L\tau_{sb})} \quad (7)$$

More generally, the oscillation frequency of a digitally-controlled oscillator built upon a delay chain having these characteristics can be expressed as a function of its interpolation levels as follows:

$$F(m) = \frac{1}{2\left(\left(\frac{m}{N} + 1\right)\tau_s + L\tau_{sb}\right)}, \text{ where } 0 \leq m \leq U, \text{ and } U = N \cdot (K - L) \quad (8)$$

Figure 7A:
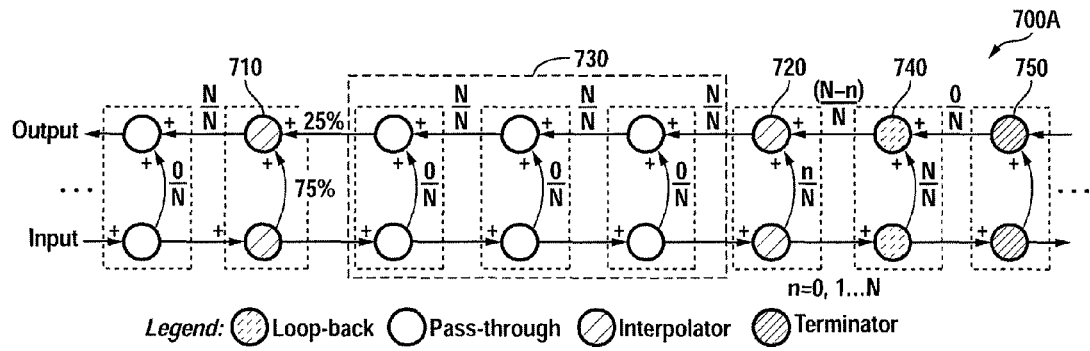
FIGS. 7A-7C show delay chains having multiple active interpolating elements in accordance with various embodiments of the present invention.
Figure 7B:
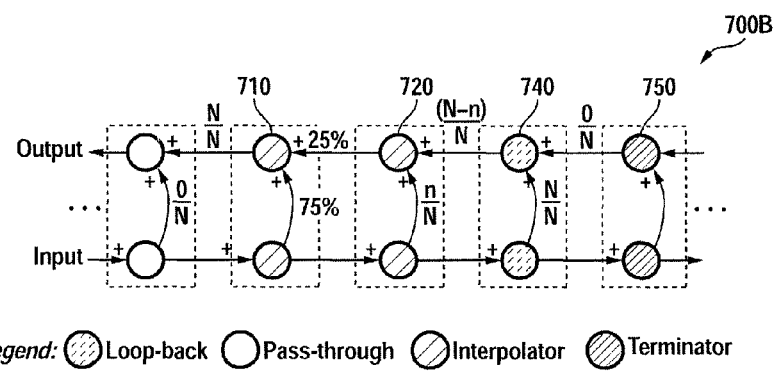
Figure 7C:
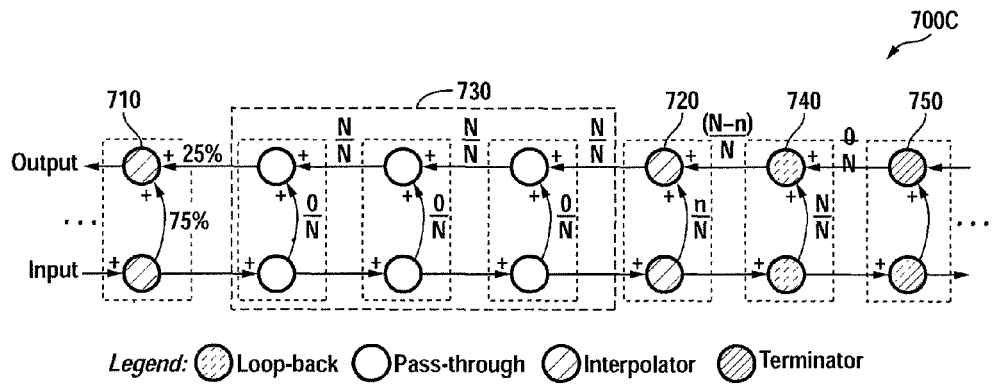

In accordance with embodiments of the present invention, the size of the delay step produced by the programmable delay elements can be reduced by allowing more than one delay element to perform phase interpolation at the same time. FIGS. 7A-7C provide an example of alternative delay chain configurations 700A, 700B, 700C each configured with two interpolating delay elements 710, 720. In the following discussion, it will be understood that individual delay elements in the respective delay chains can be programmable delay elements such as delay elements 210 (FIG. 2) and 610 (FIG. 6) having the various features as previously discussed.

As shown in FIG. 7A, a first interpolating delay element 710 is located in the second position of delay chain 700A and is configured so that its interpolated output reflects approximately 75% of the forward path input. Three delay elements 730 separate first interpolating delay element 710 from a second interpolating delay element 720. Second interpolating delay element 720 is coupled to loopback element 740 and the chain is terminated by delay element 750.

To illustrate the precise control which can be exercised over propagation delay when delay chain 700A is configured with two interpolating delay elements, the interpolation level of second interpolating delay element 720 is varied from n=0 (pass-through) to n=N (loop-back). Because the delay introduced by elements 720-740 is weighted at only 25% in the output of first interpolating delay element 710, the size of the delay step produced by changing the level of interpolation at second interpolating delay element 720 is reduced by a factor of four. Thus, by varying the interpolation level of second interpolating delay element 720, it is possible to vary propagation delay from $3\cdot\tau_s$ to $3.25\cdot\tau_s$ in steps of $\tau_s/4N$. Using delay elements as described in the previous example, the oscillation period of delay chain 700A can be adjusted in steps of approximately 1-2 ps (i.e., 4.5 ps/4=1.125 ps).

This result can be stated for a delay chain with two active interpolating delay elements (e.g., 700A) in which the first interpolator (710) has an index of interpolation n and a total of N levels of interpolation. The size of the delay step S which can be realized at the next interpolating delay element (720) expressed in terms of propagation delay $\tau_s$ is given as follows:

$$S = \frac{(1 - n_{710}/N)}{N} \cdot \tau_s, \quad (9)$$

where $n_{710}$ is the level of interpolation of element 710.

It will be recognized that delay step S in equation 9 can alternatively be expressed as a function of the base delay of individual delay elements when those delays are not uniformly distributed. For example, if delay elements 720-740 have different values of $\tau_s$, equation 9 can be restated in terms of the different delay values.

FIG. 7B shows a second delay chain 700B configured with two interpolating delay elements such as might result from shifting the variable edge of delay chain 700A three positions to the left. As with delay chain 700A, a first interpolating element 710 is located in the second position and configured to provide a 75% interpolation level. However, the control signal is swept so that delay elements 730 are reprogrammed as second interpolating delay element 720, loop-back element 740, and terminator element 750 respectively. With this delay chain configuration, the minimum propagation delay is 2.25·$\tau_s$ which is determined as $\tau_{MIN}$=0.75·(1$\tau_s$)+0.25·(2$\tau_s$)+1$\tau_s$. Thus, propagation delay can range from 2.25·$\tau_s$ up to 2.5·$\tau_s$ again with a reduction in step size as determined by first interpolating delay element 710.

FIG. 7C shows a third delay chain 700C configured with two interpolating delay elements such as might be used to further reduce the propagation delay of delay chain 700B. In this configuration, a further reduction of propagation delay is achieved by shifting first interpolating delay element 710 to the left one position. Delay elements 730 are again interposed between it and second interpolating delay element 720. As a result of the reconfiguration, propagation delay can be reduced down to 1.25·$\tau_s$. Thus, by adjusting the relative positions of first and second interpolating delay elements 710, 720 and their respective levels of interpolation, extremely fine control over propagation delay is achieved.

In some embodiments, code jumping is used in connection with reconfiguring the elements in a delay chain or oscillator having programmable delay elements. For example, the use of multiple interpolating elements can create discontinuities in a thermometer coding progression. These may take the form of "bubbles" in the code or duplicate propagation delays corresponding to two different codes. In such cases, code jumping may be implemented to preserve monotonicity. Alternatively, thermometer coding may be used over defined intervals of the code space and extra-fine tuning can be performed once a desired oscillation frequency is reached.

Reconfiguring delay chain 700 between the states shown in 700A, 700B, and 700B provides one example of how a thermometer-coded control signal can be utilized to control propagation delay. For example, the configurations of delay chain 700A and 700B may be defined in a piecewise continuous region of the code space. In that case, it is possible to seamlessly transition between delay chains 700A and 700B through a continuous thermometer coding progression. Propagation delay can thus be varied between 2.25·$\tau_s$ and 3.25·$\tau_s$ in 0.25·$\tau_s$ steps without code jumping. However, reconfiguring delay chain 700C as delay chain 700B may involve a discontinuity in the code space which can be addressed through code jumping. In such cases, it is desirable to make the adjustment in several small steps over a piecewise continuous region of the code space before making the jump in order to minimize the effect of runt pulses or other small perturbations. Thus, the present invention broadly encompasses different approaches to mapping values of a control signal to desired delay chain or oscillator behavior either in continuous linear increments or with code jumping.

Figure 8A:
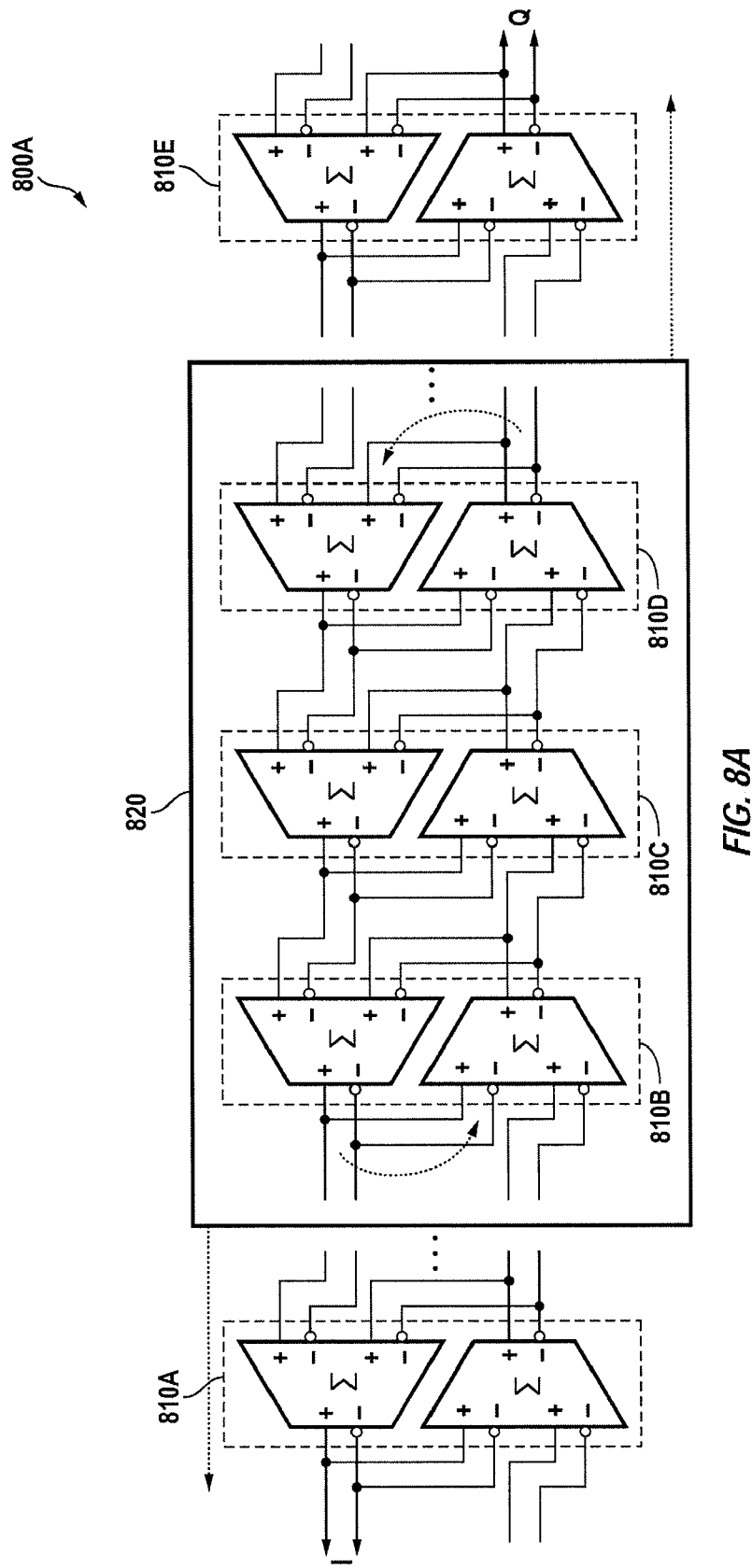
FIGS. 8A-8B show a delay chain having in-phase (I) and quadrature-phase (Q) output signals according to embodiments of the present invention.

FIG. 8A shows a delay chain 800A which supports in-phase (I) and quadrature-phase (Q) signals according to one embodiment of the present invention. As shown, each of the individual delay elements 810 includes a pair of interpolating multiplexers similar to interpolating multiplexer 400.

Delay chain 800A is configured to provide access to in-phase (I) and quadrature-phase signals (Q) at its end-taps. This is accomplished using sub-chain 820. As shown, two-mux delay elements 810B and 810D loop-back a portion of their forward path and return path signals, respectively, and thus define the ends of sub-chain 820. In addition, sub-chain 820 is configured to be symmetrical about delay element 810C so that the propagation delay is the same in both its forward and return directions.

Since a clock wave traverses delay chain 800A two full times to define a full clock cycle, the forward and return path each account for ¼th of a full delay period. Thus, the I/Q end-taps of delay chain 800A are separated by 90 degrees. When the length of delay chain 800A is changed, both ends of delay chain 800A can be adjusted simultaneously to maintain the desired phase relationship. This ensures that the center of delay chain 800A coincides with the center of sub-chain 820 (element 810C) preserving the quadrature phase relationship. It will be noted that moving the relative position of sub-chain 820 within delay chain 800A creates a skew of the propagation delays at the outputs of sub-chain 820 and delay chain 800A which can be useful for calibration purposes.

For example, sub-chain 820 can be reconfigured at both ends simultaneously or in an interleaved fashion. If the ends of sub-chain 820 are simultaneously extended to include additional delay elements 810 or reduced to include fewer delay elements 810, the I/Q phase relation remains balanced. In this case, the change in delay step is twice the delay of a two-mux delay element 810. On the other hand, if sub-chain 820 is adjusted in an interleaved manner, symmetry is not preserved and the I/Q separation would not always be exactly 90 degrees. Such an interleaved adjustment would, however, maintain the size of the delay step.

Figure 8B:
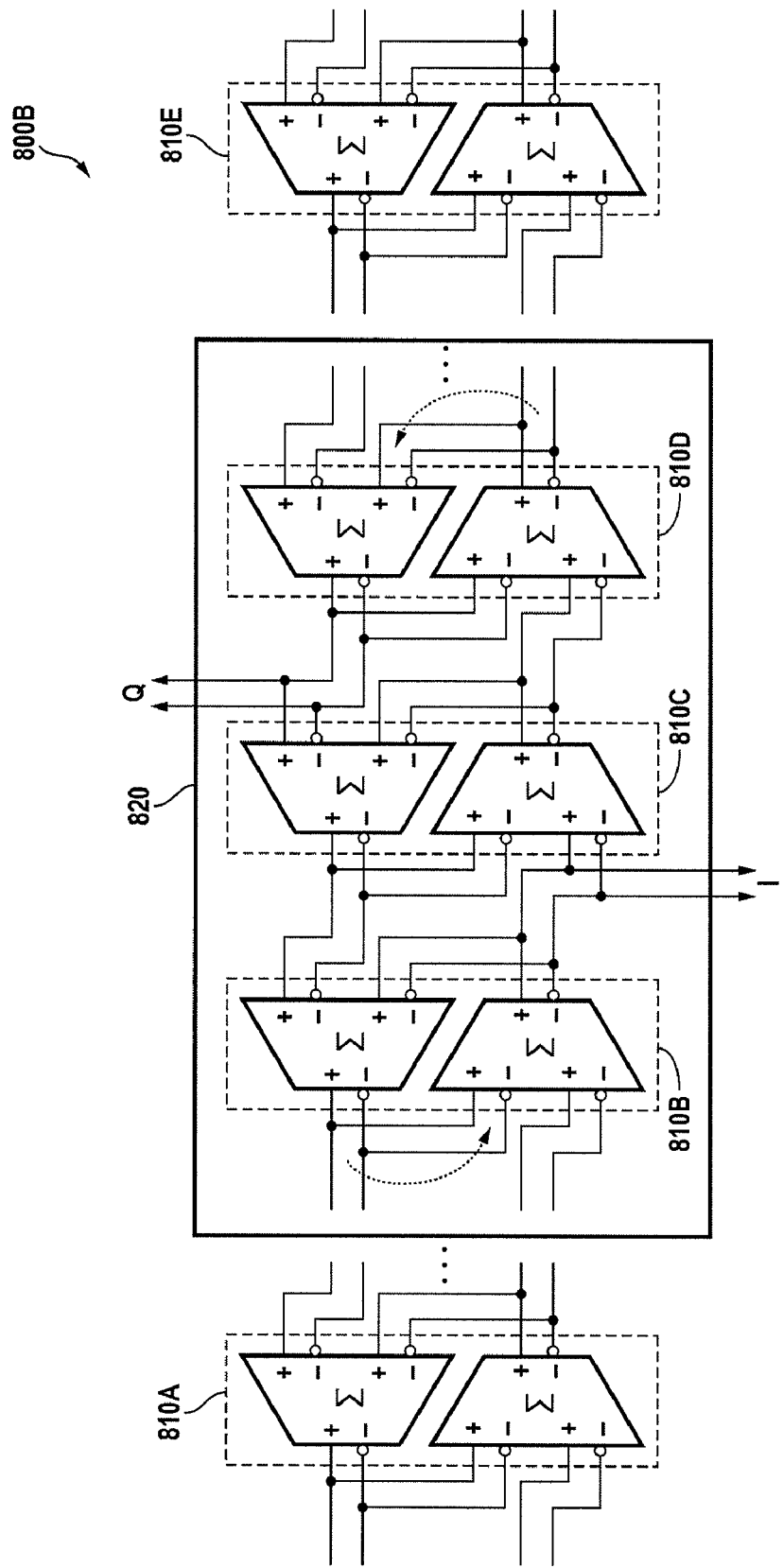

FIG. 8B shows a delay chain 800B which supports I/Q signals according to a further embodiment of the present invention. Delay chain 800B is similar to delay chain 800A except that the I/Q signals are taken at the forward path and return path inputs of center delay element 810C. The center-tap configuration of delay chain 800B is suitable for power-saving applications since the two-mux delay elements 810 outside of sub-chain 820 do not need to be powered up. In addition, because the I/Q outputs are located in close physical proximity, delay chain 800B simplifies balancing I/Q routing delays toward a destination. Delay chain 800B can be reconfigured as discussed in connection with FIG. 8A.

Figure 9:
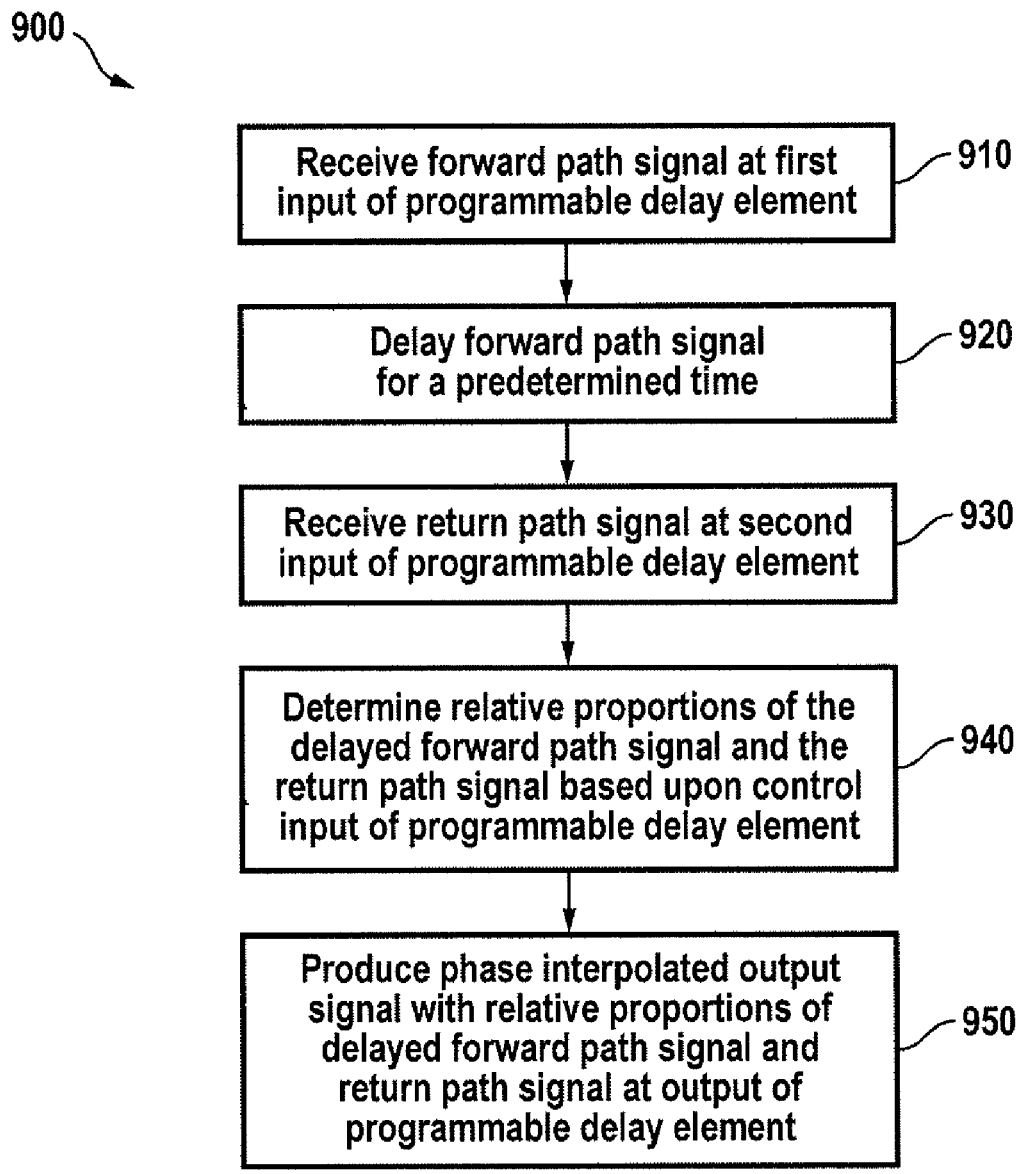
FIG. 9 is a flowchart of phase interpolation performed by a programmable delay element according to one embodiment of the present invention.

FIG. 9 is a flowchart 900 of phase interpolation performed by a programmable delay element according to embodiments of the present invention. The programmable delay element may be included as part of a digitally-controlled oscillator (DCO) or other clock synthesis, clock recovery, or jitter attenuation hardware. For example, the programmable delay element may be used to clock a microprocessor core in a system-on-chip (SoC) design, to provide a stable reference clock for SONET, DDR2, PCIe, etc. interfaces, or to recover timing information from NRZ (non return to zero) data streams.

In a first step 910, a forward path signal is received at a first input of the programmable delay element. At step 920, the forward path signal is delayed for a predetermined time. For example, a buffer may be used to delay the forward path signal and to thereby produce a phase-delayed replica which can be combined with a return path signal to produce a phase-interpolated output signal.

At step 930, the return path signal is received at a second input of the programmable delay element. In a ring oscillator configuration, for example, the return path signal can be a replica of the forward path signal which has been further delayed by other elements in the ring. Relative proportions of the delayed forward-path signal and the return path signal are determined in step 940 based upon the control input of the programmable delay element. The control input, for example, can be a digitally coded signal corresponding to the location of the programmable delay element in a larger ring-oscillator or delay chain.

A phase interpolated output signal is produced at step 950 which contains the relative proportions of the delayed forward path and return path signals as determined from the control input. In this respect, the output signal can include all, some, or none of the delayed forward path signal so that the propagation delay of the programmable delay element changes in response to the control signal input.

The above embodiments of the present invention are illustrative and not limiting. Various alternatives and equivalents are possible. Other additions, subtractions or modifications will be obvious in view of the present disclosure and are intended to fall within the scope of the appended claims.

What is claimed is:

1. A programmable delay element, comprising:
   a buffer configured to receive a source signal at a first input of the programmable delay element and to provide a first delayed replica of the source signal at a first output of the programmable delay element; and
   an interpolating multiplexer comprising a first input coupled to an output of the buffer, a second input coupled to a second input of the programmable delay element for receiving a second delayed replica of the source signal, and a third input for receiving a digital control signal comprising a plurality of bits, the interpolating multiplexer further comprising a plurality of switching elements, each switching element being operative in response to a corresponding bit of the digital control signal,
   wherein the interpolating multiplexer is configured to produce an output signal at a second output of the delay element comprising a first contribution of the first delayed replica and a second contribution of the second delayed replica in accordance with a state of the plurality of switching elements.

2. The programmable delay element of claim 1, wherein responsive to a first state of the digital control signal, a ratio of the first contribution to the second contribution is approximately zero.

3. The programmable delay element of claim 1, wherein responsive to a second state of the digital control signal, a ratio of the second contribution to the first contribution is approximately zero.

4. The programmable delay element of claim 1, wherein the interpolating multiplexer comprises N switching elements, and wherein a ratio of the first contribution to the second contribution ranges from 1/N to (N−1)/N.

5. The programmable delay element of claim 1, wherein the output signal of the interpolating multiplexer has a different phase for each value of the digital control signal.

6. The programmable delay element of claim 1, wherein the digital control signal comprises a thermometer coded value.

7. The programmable delay element of claim 1, wherein the switching elements are configured such that adjacent values of the digital control signal produce approximately linear phase steps in the output signal.

8. The programmable delay element of claim 1, further comprising a plurality of current sources, and wherein each switching element in the plurality of switching elements is coupled to a corresponding current source in the plurality of current sources.

9. The programmable delay element of claim 1, wherein the buffer is configured to delay the first delayed replica for a predetermined time.

10. The programmable delay element of claim 1, wherein the interpolating multiplexer and the buffer receive differential signals at their respective inputs and produce differential signals at their respective outputs.

11. The programmable delay element of claim 1, further comprising a rate-limiting circuit configured to control a rate of change of the first and second contributions in response to the digital control signal.

12. A programmable delay chain comprising:
    at least first, second, and third delay elements, each delay element including:
    a buffer configured to receive a source signal at a first input of the delay element and to provide a first delayed replica of the source signal at a first output of the delay element, and
    an interpolating multiplexer having a first input coupled to an output of the buffer, a second input coupled to a second input of the delay element and for receiving a further delayed replica of the source signal, and a third input for receiving a digitally coded control signal comprising a plurality of bits,
    the interpolating multiplexer comprising a plurality of switching elements, each switching element being operative in response to a corresponding bit of the digital control signal, wherein the interpolating multiplexer is configured to produce an output signal at a second output of the programmable delay element comprising a first contribution of the first delayed replica and a second contribution of the second delayed replica in accordance with a state of the switching elements,
    wherein the first, second, and third delay elements form a chain in which the first inputs and first outputs of the delay elements comprise a forward signal path and the second inputs and second outputs of the delay elements comprise a return signal path.

13. The programmable delay chain of claim 12, wherein the second output of the first delay element is coupled to the first input of the first delay element so as to produce a self-sustaining oscillation of the source signal in the first, second, and third delay elements.

14. The programmable delay chain of claim 12, wherein the third delay element is configured to deliver substantially all of the first delayed replica to the second output of the third delay element in response to a state of the digital control signal.

15. The programmable delay chain of claim 12, wherein the second delay element is configured to deliver substantially all of the second delayed replica to the second output of the second delay element in response to a state of the digital control signal.

16. The programmable delay chain of claim 12, wherein the digitally coded control signal received at the first, second, and third delay elements corresponds to a phase error between the output of the delay chain and a reference signal.

17. The programmable delay chain of claim 12, wherein the output signal of at least two of the delay elements in the programmable delay chain comprises a weighted sum of the first and second inputs of said at least two of the delay elements.

18. A delay chain having a plurality of programmable delay elements connected to exchange forward and return path clock signals, each programmable delay element in the delay chain generating an output signal by combining discrete portions of its respective forward and return path clock signals in accordance with an index of interpolation, the delay chain comprising:

a first programmable delay element having a first index of interpolation, the first programmable delay element being configured to produce an interpolated output by combining a first portion of an input clock signal received on its forward path and a second portion of its return path clock signal as determined by the first index of interpolation;

a second programmable delay element having a second index of interpolation, the second programmable delay element configured to receive its forward path clock signal from the first programmable delay element, and to produce a second interpolated output by combining a first portion of its forward path signal and a second portion of its return path clock signal as determined by the second index of interpolation, and a third programmable delay element having a third index of interpolation, the third programmable delay element configured to receive its forward path clock signal from the second programmable delay element, and to produce a third interpolated output signal as determined by the third index of interpolation, wherein the return path clock signal of the second programmable delay element comprises the interpolated output of the third programmable delay element, and the return path clock signal of the first programmable delay element comprises the interpolated output of the second programmable delay element.

19. The delay chain of claim 18, wherein the second index of interpolation is operative such that both the forward path and return path clock signals of the second programmable delay element contribute to the interpolated output signal of the second delay element.

20. The delay chain of claim 19, wherein the third index of interpolation is operative such that both the forward path and return path clock signals of the third programmable delay element contribute to the interpolated output signal of the third delay element.

21. The delay chain of claim 18, wherein the interpolated output of the first programmable delay element is returned to the first programmable delay element as the input clock signal such that the delay chain produces a self-sustaining oscillation of the forward and return path signals.

22. The delay chain of claim 21, wherein a frequency of the self-sustaining oscillation is determined by the first, second, and third indices of interpolation.

* * * * *